US008003512B2

(12) United States Patent
Belanger et al.

(10) Patent No.: US 8,003,512 B2
(45) Date of Patent: Aug. 23, 2011

(54) STRUCTURE OF UBM AND SOLDER BUMPS AND METHODS OF FABRICATION

(75) Inventors: Luc L. Belanger, Quebec (CA); Marc A. Bergendahl, Troy, NY (US); Ajay P. Giri, Poughkeepsie, NY (US); Paul A. Lauro, Brewster, NY (US); Valerie A. Oberson, Alphonse de Granby (CA); Da-Yuan Shih, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 37 days.

(21) Appl. No.: 12/364,684

(22) Filed: Feb. 3, 2009

(65) Prior Publication Data

US 2010/0193949 A1    Aug. 5, 2010

(51) Int. Cl.
    *H01L 21/44* (2006.01)
(52) U.S. Cl. ......... 438/612; 438/614; 438/615; 438/616
(58) Field of Classification Search ........... 438/612–617
    See application file for complete search history.

(56) References Cited

U.S. PATENT DOCUMENTS

| 2003/0013290 A1* | 1/2003 | Greer | 438/612 |
| 2003/0134497 A1* | 7/2003 | Saijo et al. | 438/612 |

OTHER PUBLICATIONS

NiV Paper on Electromigration, V. Wakharkar, C. Matayabas, E. Lehman, R. Manapelli, M. Renavikar, et al., "Material Technologies for Thermomechanical Management of Organic Packages" Intel Technology Journal vol. 09(4), 2005, pp. 309-323. (See attached file Intel Paper vol. 09_art2005.pdf).
(El-Ni-P Papers), P. Snugovsky, P. Arrowsmith, P. M. Romansky, "Electroless Ni-immersion Au Interconnects: Investigation of Black Pad in Wire Bonds and Solder Joints", J. Electronic Materials, vol. 30, n. 9 (2001) p. 1262-1270—see http://findarticles.com/p/articles/mi_qa3776/is_/ai_n8991038?tag=artBody;coll.
K. Semkow, L. Wiggins, PI Flaitz, C. Goldsmith, "Investigation of Distribution of Phosphorous in Electroless Ni(P) Films", 207th Meeting of the Electrochem. Society, Quebec, Canada. Meeting Abstracts, May 2005, pp. 369—see http://scitation.aip.org/getpdf/servelet/GetPDFServlet?filetype=pdf&id-MAECES000501000007000369000001&idtype=cvips&prog=normal.
K. Zeng, R. Stierman, D. Abbott, M. Murtuza, "The Root Cause of Black Pad Failure of Solder Joints with Electroless Ni/immersion gold plating", J. of Metals, vol. 58, n. 6 (2006), p. 75-79—see http://www.springerlink.com/content/67t56r8370814863/http://www.ingentaconnect.com/content/klu/jom/2006/00000058/00000006/art00022.
NiV and Ni Film Stress, Characterization of reaction rates and intermetallic phase formation for Cu, Ni and NiV UBM layers with SnPb and lead-free SnAg solders, paper by K. O'Donnell et al., Flip Chip Conference 2004.
Under Bump Metallization for Pb-Free Bumping, Se-Young Jang, Ph.D., Micro-Joining Lab, Mechatronics Center, Samsung Electronics Co. Ltd., Heinz Gloor, Product Manager Unaxis Semiconductors, Advanced Packaging vol. 21.
Development of Implementation of C4NP Technology for 300 mm wafers, A. Giri, E. Perfecto, Hai Longworth, K. Semkow, S. Knickerbocker, IBM Systems & Technology Group (STG).

* cited by examiner

*Primary Examiner* — Leonardo Andújar
(74) *Attorney, Agent, or Firm* — DeLio & Peterson, LLC; Kelly M. Nowak; Joseph Petrokaitis (57) ABSTRACT

Methods and UBM structures having bilayer or trilayer UBM layers that include a thin TiW adhesion layer and a thick Ni-based barrier layer thereover both deposited under sputtering operating conditions that provide the resultant bilayer or trilayer UBM layers with minimal composite stresses. The Ni-based barrier layer may be pure Ni or a Ni alloy. These UBM layers may be patterned to fabricate bilayer or trilayer UBM capture pads, followed by joining a lead-free solder thereto for providing lead-free solder joints that maintain reliability after multiple reflows. Optionally, the top layer of the trilayer UBM structures may include soluble or insoluble metals for doping the lead-free solder connections.

19 Claims, 12 Drawing Sheets

STRUCTURE OF UBM AND SOLDER BUMPS AND METHODS OF FABRICATION

BACKGROUND OF THE INVENTION

1. Field of the Invention

The present invention relates to electronic devices, and in particular, to under bump metallization and solder bumps for interconnection of electronic components.

2. Description of Related Art

In the microelectronics industry, surface mount technology (SMT) involves forming electronic package assemblies in which an electrical component, such as an integrated circuit chip, is electrically and mechanically connected to a substrate, a card (i.e., board), another chip or another electronic part. These multilayer electronic components are typically joined to each other by solder interconnections, such as C4 technology or flip chip packaging, or BGA (Ball Grid Array) interconnections. The solder interconnections join the pads on a first of these electronic components to corresponding pads on the surface of a second component, e.g., pads on a chip to corresponding pads on a substrate.

Conventional solder materials for soldering semiconductors to ceramic substrates include high melting point solder alloys having a high lead content. For instance, a preferred solder material for forming solder joints over the years has been a composition of 97 wt % lead (Pb) to 3 wt % tin (Sn). These lead containing solder joints are generally plated or evaporated solder on under bump metal (UBM) films. Typical UBM films for use with lead containing solders include an adhesion layer (e.g., TiW) followed by a diffusion barrier layer (e.g., CrCu) and then a capping or solder wettable layer (e.g., Cu). While such UBM film compositions provide adequate performance and reliability when used with lead containing solders, they are neither adequate nor reliable when used with lead-free solders as discussed below.

Over the years, due to the continually increasing costs and environmental factors, industry is shifting more towards the use of lead-free solders. Known lead-free solders for use in the semiconductor industry are generally tin-rich, such as, for example, tin-copper (Sn/Cu), tin-silver (Sn/Ag) or tin-silver-copper (Sn/Ag/Cu) solders. However, when these tin-rich solders are provided over the CrCu barrier layers, the high tin (Sn) content results in the rapid consumption of copper (Cu) from the CrCu UBM, leading to solder joint delamination. This high tin (Sn) content also reacts with the chromium (Cr) causing it to float to solder joint surfaces, which in turn, leads to non-wettable solder joints.

To avoid the above problems associated between CrCu barrier UBM layers and lead-free solder joints, nickel (Ni) or nickel vanadium (NiV) barrier UBM layers have replaced the CrCu barrier UBM layers. These Ni and NiV barrier UBM layers exhibit a slower reaction rate between Ni and Sn as compared to the reaction rate between Cu, or CrCu and Sn. Typically, the Ni UBM layers are electroless plated and NiV sputtered onto the adhesion layer. In so doing, electroless plated nickel phosphorous (EL-Ni—P) UBM layers are deposited to a thickness of about 2 to about 5 microns, while the sputtered Ni or NiV layers are deposited to a thickness of about 0.3 to about 0.5 microns.

While lower thicknesses of the EL-Ni—P or NiV UBM layers provide solutions for low-end applications, it does not meet the needs for high-end, high-performance applications. The process of depositing these layers by electroless plating incorporates P atoms in an EL-Ni—P layer or V atoms in NiV layers. However, it has been found that these impurities are undesirable in the barrier layer since the multiple solder reflows and thermal migration/diffusion of V impacts barrier consumption, and P atoms affecting the electromigration performance and reliability of C4 interconnections. The higher stresses in these EL-Ni—P or NiV layers may also detrimentally lead to fractures in the subsurface, which is commonly referred to in the industry as the "white bump" problem. Further, the conventional approaches for sputtering Ni or NiV provide UBM layers that are too thin, such that, they are completely consumed after about 4-5 reflows, each at about 250° C. to 260° C. for about 5 minutes. Sputtering these Ni or NiV layers too thick may also detrimentally result in higher stresses, for example, residual stresses in the range of 200 MPa to 600 MPa, which in turn, results in excessive wafer bowing causing difficulty in chucking and auto handling processes (e.g., for those wafers bowed at 600 microns or higher).

However, sputtering techniques continue to be preferred for present and future generations of UBM layers due to process simplicity, ease in process integration, cost effectiveness and the ability to overcome the performance limitations associated with Electroless plated Ni—P and sputtered NiV UBMs.

SUMMARY OF THE INVENTION

Embodiments of the invention are directed to methods of fabricating UBM structures that at least include providing a substrate having electrically conductive connections. The substrate is provided in a sputtering tool, and a surface of this substrate is cleaned. At least a bilayer UBM structure is deposited over the cleaned substrate surface by sputter depositing a TiW adhesion to a thickness ranging from about 0.05 microns to about 0.3 microns followed by depositing a Ni-based barrier layer to a thickness ranging from about 0.6 microns to about 3.0 microns. These bilayers of the UBM are deposited under operating conditions that provide the resultant bilayer UBM structure with composite stress close to zero. The bilayer UBM structure is patterned to from bilayer UBM capture pads on the substrate surface, and lead-free solder connections are joined to the bilayer UBM capture pads to provide solder joints having reliable joint strengths after multiple reflows.

Other embodiments of the invention are UBM structures fabricated in accordance with the processes and methods described herein.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiments of the present invention, reference will be made herein to FIGS. 1A-10C of the drawings in which like numerals refer to like features of the invention.

One or more embodiments of the invention are directed to under bump metal (UBM) layers, and in particular, to enhanced UBM layers for use with lead-free solders for interconnection of components in electrical assemblies that prevent damage and/or fractures in the underlying substrate layering. The embodiments of the invention are useful for any type of current and/or future generation of lead-free solder or lead-free solder alloys including, but not limited to, Sn, Sn/Ag, Sn/Ag/Cu, Sn/Cu, and other suitable ternary and quaternary Sn based alloys and like. These lead-free solders and solder alloys reside on the UBM layers as solder balls, solder columns, solder bumps, micro bumps & balls etc. It should also be appreciated that the embodiments of the invention are suitable for use in a wide variety of electrical assemblies including, for example, organic packages on a board, i.e. Flip Chip Plastic Ball Grid Array (FCPBGA) packages, silicon chips on a board, ceramic modules, organic modules, wafer level packages (WLPC), chip stacks, chip scale packages (CSP), high density interconnects using micro bumps, where one chip is attached to another, and the like.

Referring to FIGS. 1A-1E, the embodiments of the present UBM layers may be provided on and reside a variety of starting wafer or substrate structures. In general, each of these structures includes an electrical component or substrate 10 having electrically conductive input and output (I/O) connections 12 in communication with interconnect metallic pads 15 for connection to solder joints. The substrate 10 may be any known substrate including, but not limited to, a ceramic substrate, a silicon substrate, glass substrate, an organic substrate, and the like. For example, the substrate 10 may be a standard Silicon wafer. The via I/O power connections 12 may include, for example, Cu wiring or any low K dielectric. As for the metallic pads of the assembly, they are typically larger in diameter than the via I/O power connections with which they make contact. These interconnect metallic pads 15 typically comprise a metal or metal alloy including, but not limited to, Al, Cu, W, Cu/Ni, TaN coated Cu, TiN coated Cu, and the like, and may have a thickness ranging from about 0.5 micron to about 4 microns.

Figure 1A:
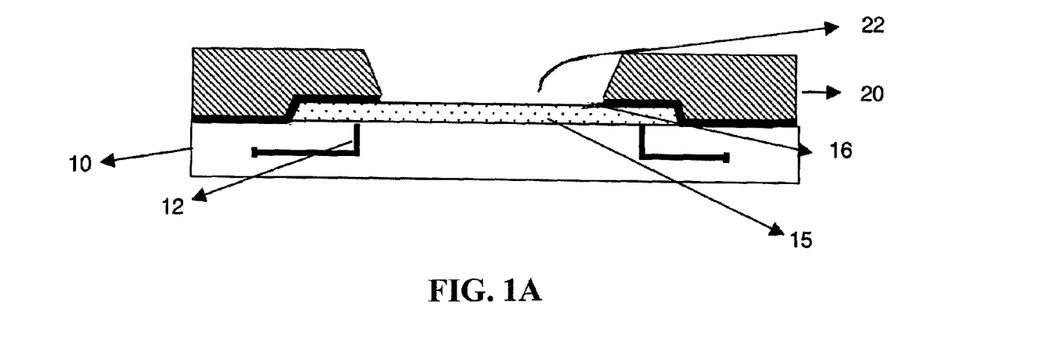
FIGS. 1A-1E illustrate cross sectional views of starting wafers or substrates suitable for use in the present invention.
Figure 1B:
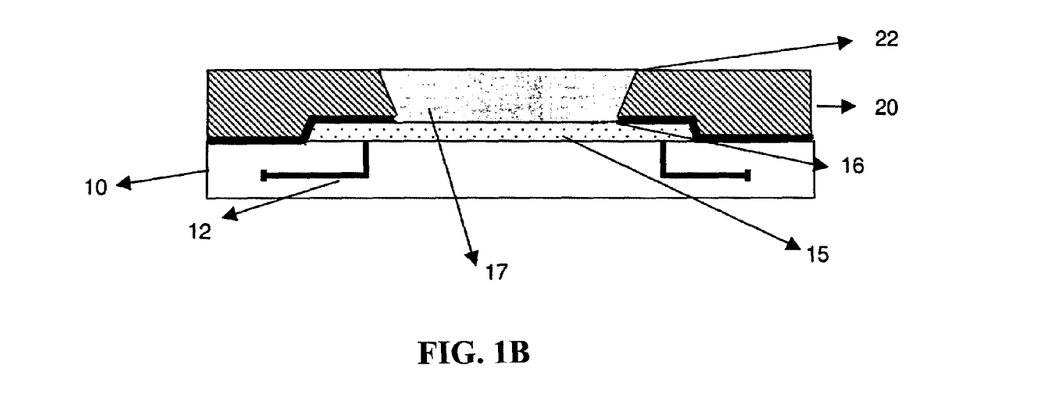
Figure 1C:
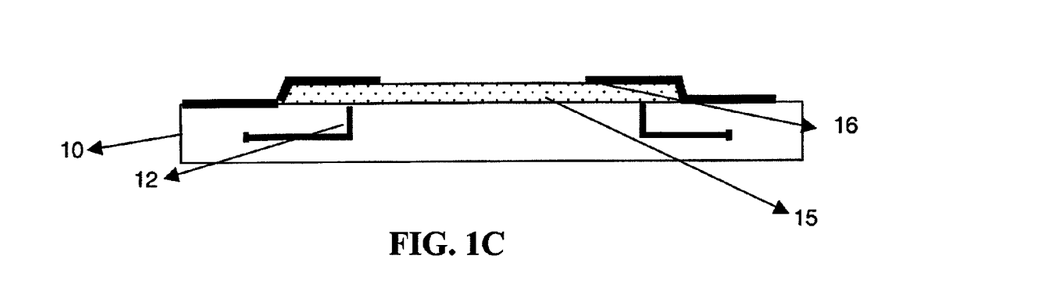
Figure 1D:
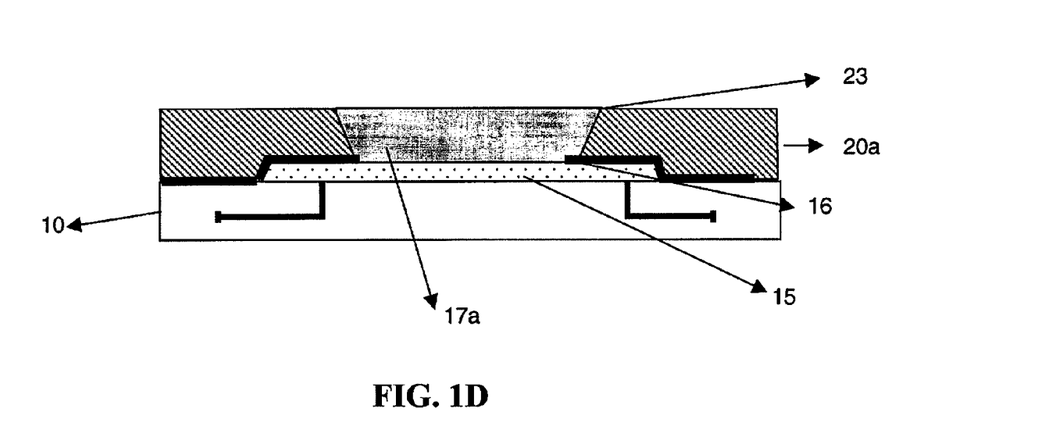

Depending upon the utility of the final assembly, a single passivation layer or combined passivation layers may be provided over and reside on the substrate 10. Referring to FIGS. 1A and 1B, a combined passivation layer of a silicon nitride (Si3Ni4) or silicon oxide (SiO2) passivation layer 16 may be provided over the surface of the substrate 10 followed by deposition of a surface passivation layer 20 over layer 16. The surface passivation layer 20 may include, for example, polyimides or photosensitive polyimides deposited to a thickness ranging from about 1 micron to about 10 microns. Once the passivation layer(s) resides on the substrate surface, patterning this passivation layer(s) forms via openings 22 therein to expose the metallic pads 15 at the bottoms of such openings. These vias may be filled with a metal material and planarized.

Figure 1E:
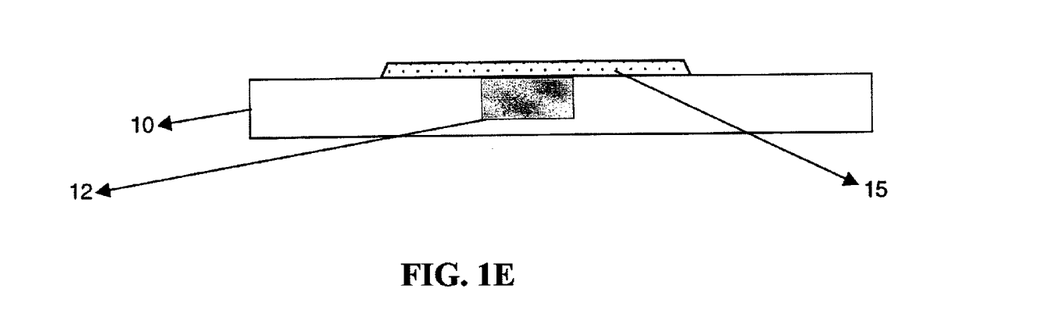
Figure 2A:
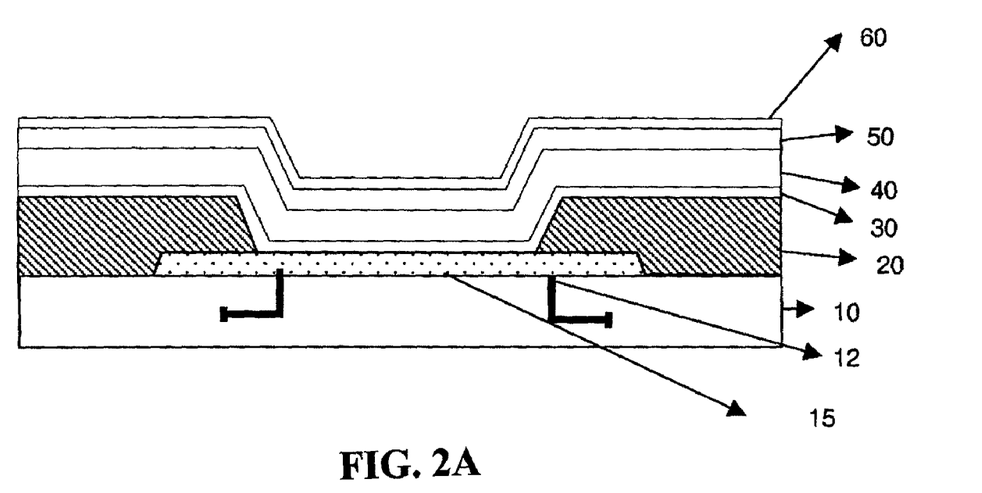
FIGS. 2A and 2B illustrate cross sectional views of the bilayers and trilayers of the UBM structures made in accordance with the invention.
Figure 2B:
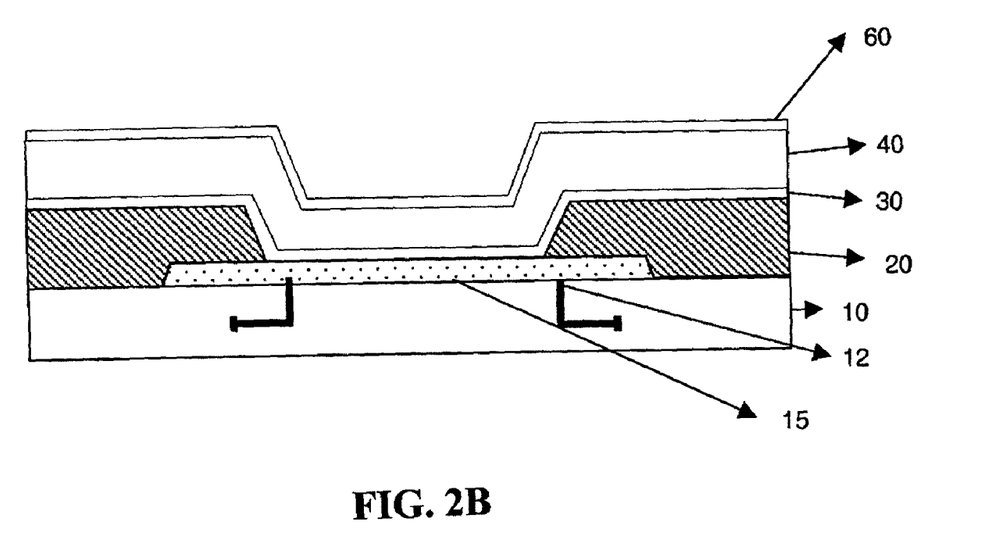

For instance, the structures of FIGS. 1A and 1B may include a silicon substrate 10 having Cu wiring or low K dielectric interconnects 12 in electrical communication with Al or Cu pads 15. A Si3N4 or SiO2 passivation layer 16 is provided over the structure surface, followed by deposition of polyimide layer 20. PSPI (photosensitive polyimide) vias 22 are then formed in the polyimide layer and filled with Cu to form Cu filled vias 17. Alternatively, referring to FIG. 1D, the passivation layer 20a may include a Si3N4 or SiO$_2$ layer with via openings 23 therein that are filled with Cu or W to form Cu or W plugs in a Si layer. This type of structure is suitable for use in three-dimensional Si interconnects or Si interposers. As other alternatives of the starting substrate, the structure may be provided with a single passivation layer of either passivation layer 16 (FIG. 1C) or passivation layer 20 (FIG. 2B). The use of a single Si3N4 or SiO2 passivation layer 16 renders the resultant structure suitable for use in memory applications. Referring to FIG. 1E, another alternative of the starting substrate suitable for packaging applications is shown, whereby this structure includes a ceramic or organic substrate 10 having Cu wiring or vias 12 that are in electrical communication with Cu or Cu/Ni pads 15.

Prior to providing the UBM layers over any of the structures shown in FIGS. 1A-1E, the substrate 10, having the passivation layer 20 on a surface thereof, is processed in a heated chamber in the presence of an inert gas, such as N$_2$ or Ar, to remove any moisture from the surface of the passivation layer 20. Preferably, the substrate is heated at temperatures ranging from about 100° C. to about 320° C. in the presence of N$_2$ or Ar gas for a time sufficient to remove adsorbed moisture and any residual solvent traces from the passivation layer 20, more preferably at about 320° C. for about 2 to about 6 minutes.

The structure surface is then cleaned to remove any oxide films/layers from the exposed metal pads 15 to ensure low contact resistance between the metal pads and the subsequently deposited UBM layers. In so doing, the exposed surfaces are sputter etch cleaned using an inductively coupled plasma (e.g., Ar plasma) with RF biasing to remove oxide films from the exposed metal pads 15. The preferred operating conditions for this sputter etch cleaning step is an Ar pressure ranging from about 0.75 mTorr to about 1.0 mTorr, inductive power ranging from about 300 Watts to about 500 Watts, preferably at 450 Watts, and an RF bias power ranging from about 200 to about 300 Watts, with an SiO$_2$ etch rate of about 3 to about 4 A/sec.

Upon completion of this sputter cleaning process, the substrate is cooled for about 2 minutes to about 10 minutes under vacuum in the presence of an inert gas (e.g., N$_2$ or Ar) at temperatures ranging from about 30° C. to about 100° C. This cooling step generates improved reproducibility of composite stresses in the subsequently formed UBM layers of one or more embodiments of the invention.

For ease of understanding the one or more embodiments of the invention, the following description of the present UBM layers are provided over a structure substantially similar to that shown in FIG. 1A. Referring to FIGS. 2A-2B, the UBM layers at least include bilayers of an adhesion layer 30 with a thick barrier layer 40 deposited over the adhesion layer 30. The adhesion layer 30 preferably comprises a sputtered layer of TiW (10/90 Wt %) deposited to a thickness ranging from about 0.05 microns to about 0.3 microns, more preferably to a thickness of about 0.165 microns. The adhesion layer is deposited over the cleaned structure surface to provide adhesion to both the passivation layer 20 and any exposed metal layer (e.g. metal pads 15), as well as to act as a diffusion barrier to solder.

The TiW adhesion layer 30 is directly sputtered on the passivation layer and any metal layer under operating conditions that are optimal for providing the TiW adhesion layer 30 with low compressive stresses when deposited onto an inorganic substrate (e.g., Si-oxide substrate) and high compressive stresses when deposited onto an organic substrate (e.g., polyimide coated wafers). That is, the one or more embodiments of the invention provide operating conditions for generating a desired level of compressive film stress on either an organic or an inorganic substrate.

In so doing, in one or more embodiments of the invention the preferred optimal operating conditions (preferably on an Endura™ platform) for depositing the TiW adhesion layer 30 onto an inorganic substrate include a sputtering temperature ranging from about 25° C. to about 270° C. in the presence of Ar gas at a pressure ranging from about 1.8 mTorr to about 7.5 mTorr, more preferably at a pressure ranging from about 4-5 mTorr. While the operating power conditions range from about 4 kW to about 12 kW, more preferably at about 8 kW, it should be appreciated that the operating power may vary depending upon the size of the sputter target. It should also be appreciated that the operating temperatures may vary depending on the type of sputtering tool used (e.g., for a rotating magnetron tool (e.g., Endura™ platform) the electrode temperature may range from about 25° C. to about 270° C.; while for a linear magnetron tool the electrode temperature may range from about 25° C. to about 50° C.).

Figure 3:
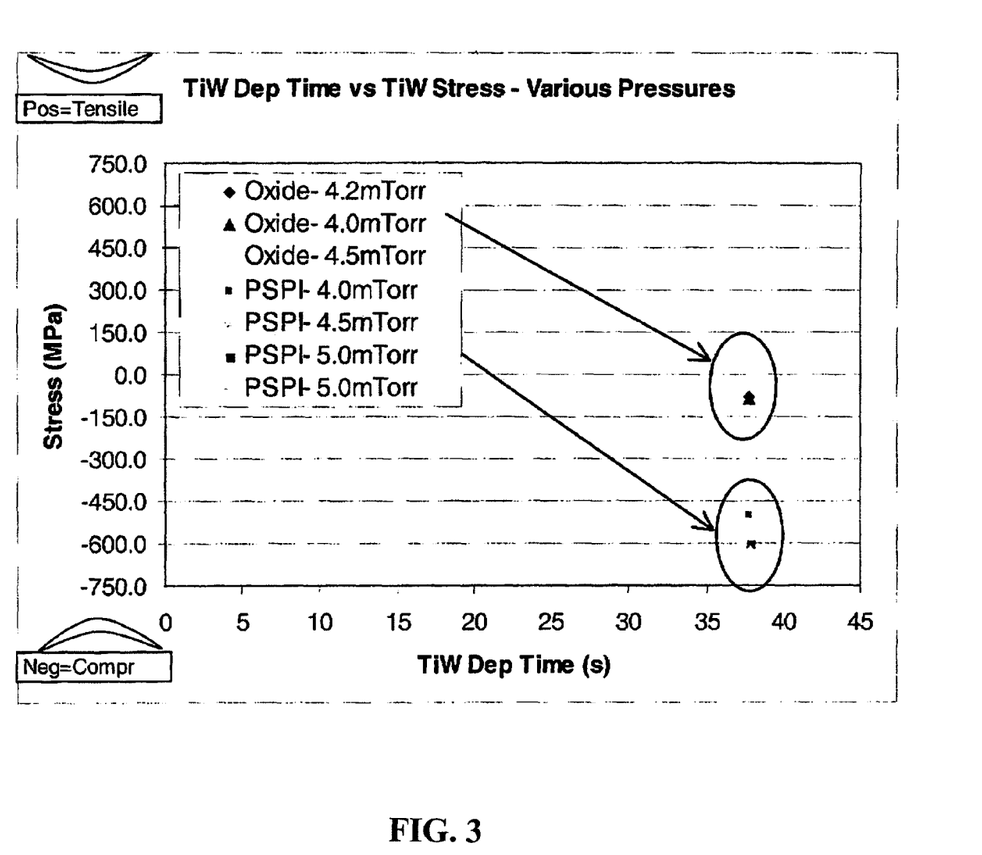
FIG. 3 is a graph depicting the low stresses in the present TiW adhesion layers of the invention.

In the one or more embodiments of the invention the optimal operating conditions (also preferably on an Endura™ platform) for depositing the TiW adhesion layer 30 onto an organic substrate include the above operating conditions; however, the preferred sputtering temperature ranges from about 250° C. to about 270° C. By depositing TiW onto a substrate under the foregoing operating conditions, it is shown in FIG. 3 that the resultant TiW adhesion layers 30 have low compressive stresses when deposited on an inorganic substrate (e.g., oxide substrates) and high compressive stresses when deposited on an organic substrate (e.g., PSPI substrates).

Once the TiW adhesion layer has been deposited, the thick barrier layer 40 of the UBM structure is deposited directly over the adhesion layer 30. This barrier layer 40 can be deposited in a separate processing chamber or in the same chamber under controlled operating conditions, such that, film stresses in the barrier layer 40 are low compressive or low tensile on either organic (polyimides) or inorganic (oxide) substrates or wafers. For instance, the barrier layer 40 is deposited under the present operating conditions such that it has stresses ranging between about −275 MPa (low compressive) to about +50 Mpa (low tensile).

The barrier layer of the one or more embodiments of the invention is a nickel-based layer deposited to a thickness ranging from about 0.6 microns to about 3.0 microns. The nickel-based barrier layer 40 may be a pure nickel layer (100% Ni) or a nickel alloy layer (Ni—X). The nickel alloys may include NiSi (Si 4.5 wt %), NiW (W 10 At %), NiTi (Ti 7-10 wt %), NiCu (Cu 10-60 wt %) or NiSn (Sn 5-10 At %). Preferably, the nickel alloy barrier layer comprises a NiSi barrier layer with Si present in an amount ranging from about 3% to about 6% by weight or a NiW barrier layer with W present in an amount ranging from about 5% to about 15% by atomic percent (At %).

In accordance with the one or more embodiments of the invention, the nickel-based barrier layer 40 is more preferably deposited by PVD, which uses different chambers for depositing different metals, (e.g., using the Endura™ platform) or preferably by a linear magnetron sputtering that employs a single chamber for depositing different layers whereby the substrates therein are scanned back and forth under the specific metal target. The optimal operating conditions for sputtering this barrier layer onto the adhesion layer include cooling the substrate on a water cooled electrode that is maintained at a temperature ranging from about −20° C. to about 40° C. in the presence of Ar gas at a pressure ranging from about 1.8 mTorr to about 6.0 mTorr, more preferably at a pressure of about 4 mTorr.

The preferred operating power conditions for depositing the nickel-based barrier layer 40 include a DC power ranging from about 6 kW to about 14 kW, most preferably at about 12 kW, and an RF bias power applied to the substrate ranging from about 0 Watts to about 300 Watts, most preferably at about 200 Watts. In accordance with the one or more embodiments of the invention, it has been found that the higher DC power applied to the sputter target increases the deposition rate of the thick nickel-based barrier layer 40, and as such, is preferred for increased productivity. This low RF bias power applied to the substrate during the barrier deposition process provides the present nickel-based barrier layers 40 with low stresses, which in turn, provides the resultant bilayer UBM with low stress. These low RF bias powers also enable the control of keeping surface potentials of the substrate below 100 Volts, which prevents damage to any sensitive active electrical areas or devices on the substrate.

Figure 4A:
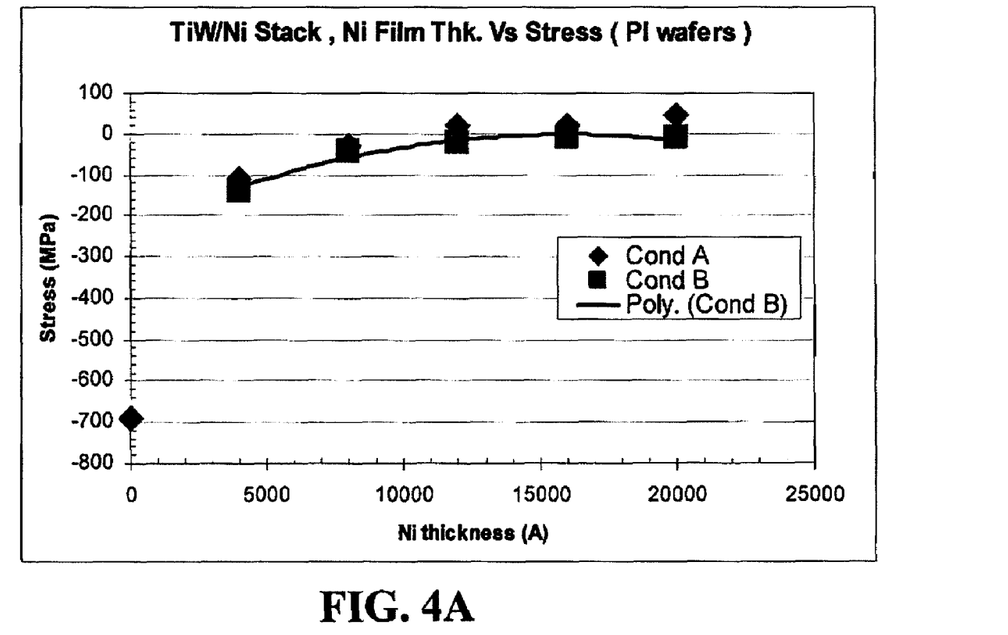
FIGS. 4A and 4B are graphs respectively depicting the low stresses and reduced bowing in the present bilayer TiW/Ni UBM structure of the invention.
Figure 4B:
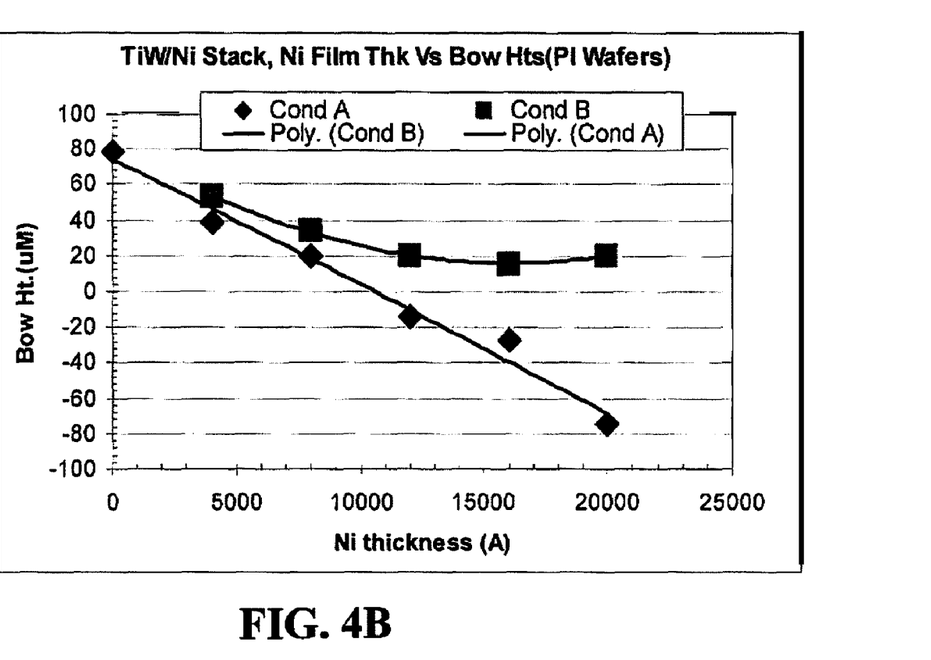

Referring to FIGS. 4A-5B, in accordance with one or more embodiments of the invention, the amount of RF bias power applied during the Ni-based barrier layer deposition process, for achieving the results of a bilayer (TiW/Ni-based) UBM structure having low stresses and minimum bowing, is dependent upon both the chosen material of the Ni-based barrier layer and the thickness to which such layer is deposited. FIGS. 4A and 4B show the lower stresses and minimum bowing of a bilayer TiW/Ni UBM stack made in accordance with one or more embodiments of the invention. As is shown, lots of organic wafers (e.g., polyimide (PI) wafers) were tested under two different RF bias operating conditions, namely, Condition A operating at 100 Watts and Condition B operating at 200 Watts. For both operating conditions, the Ni-based barrier layers 40 were deposited to a thickness ranging from about 0.5 microns (i.e., 5000 Å) to about 2.0 microns (i.e., 20000 Å), whereby the stresses in the resultant TiW/Ni bilayer ranged anywhere from about −140 MPa to about +40 MPa depending on film thickness. That is, the stress in the present barrier layer is a function of the barrier layer thickness, changing as the thickness of the barrier layer changes. Referring to FIG. 4B, the amount of bowing in the TiW/Ni UBM stack is a function of both the UBM stress and the thickness of the Ni barrier layer and ranges from about +80 microns to about −80 microns in the TiW/Ni UBM stack.

Figure 5A:
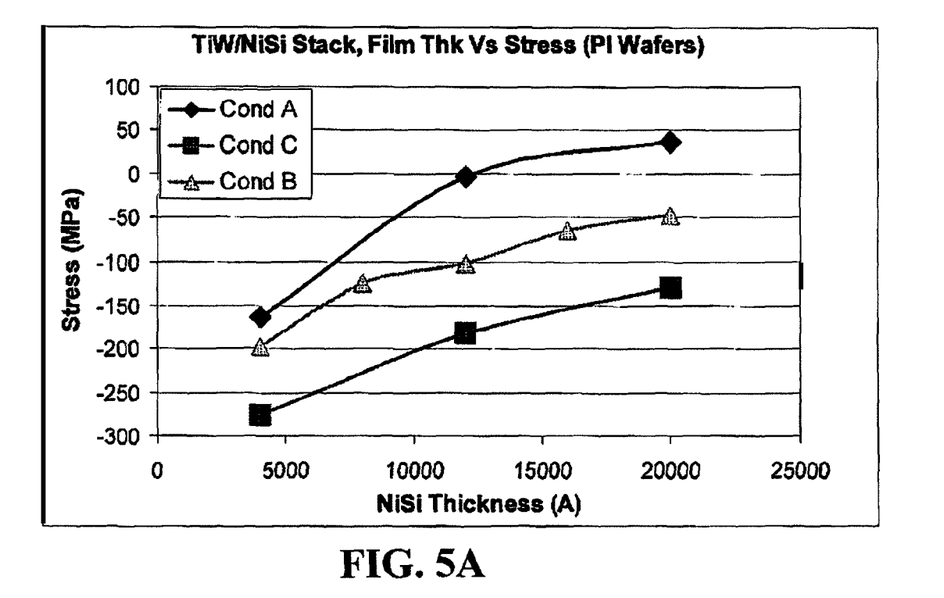
FIGS. 5A and 5B are graphs respectively depicting the low stresses and reduced bowing in the present bilayer TiW/NiSi UBM structure of the invention.
Figure 5B:
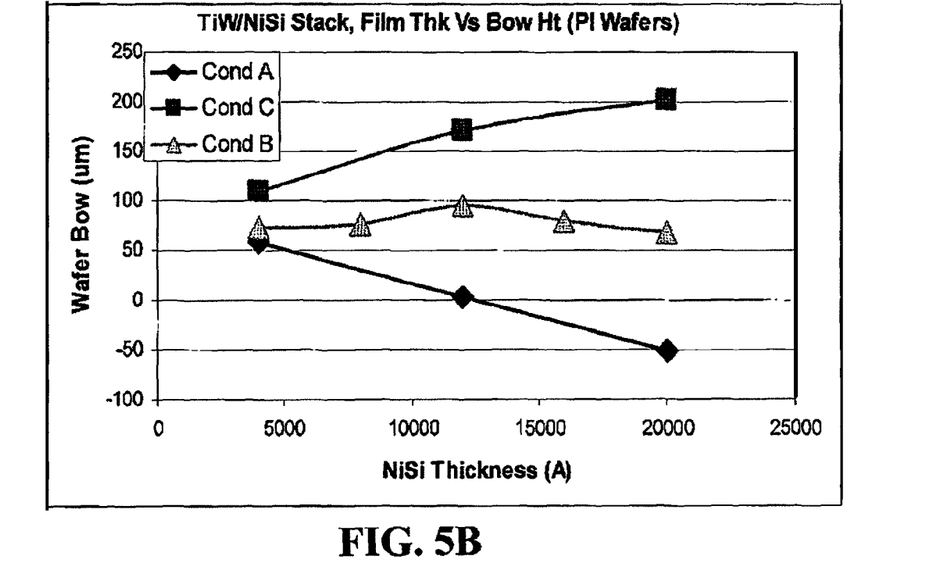

FIGS. 5A and 5B show the lower stresses and minimum bowing of a bilayer TiW/NiSi UBM stack on organic wafers made in accordance with an embodiment of the invention under RF operating conditions at Condition A operating at 100 Watts, Condition B operating at 150 Watts and Condition C operating at 200 Watts. The NiSi layers were deposited to thicknesses ranging from about 0.4 microns (i.e., 4000 A) to about 2.0 microns (i.e., 20000 A), whereby the stresses in the resultant TiW/NiSi bilayer ranged anywhere from about −275 MPa to about +40 MPa depending on film thickness, whereby the stresses in the NiSi layers were reduced (i.e., directed closer to 0 MPa) as the thickness of the NiSi layers increased. Again, the amount of bowing in the TiW/NiSi UBM stack is a function of both the UBM stress and the thickness of the NiSi layer, and ranges from about +200 microns to about −50 microns in the TiW/Ni UBM stack.

Accordingly, the optimized operating conditions of the one or more embodiments of the invention fabricates bilayer TiW/Ni-based UBM stack structures with low stresses that range from low tensile stress (i.e., +50 Mpa or lower) to low compressive stress (i.e., −275 Mpa or higher) at high deposition rates (e.g., about 100 A/sec) with acceptable uniformity. These low stresses of the resultant bilayers enable the UBM structures to withstand high stresses during downstream processing, such as, high stresses induced during downstream joining processes (e.g., bonding and assembly of modules, as well as reliability stressing of the electronic module or device). Also, these properties of the resultant bilayer UBM structures provide the resultant electronic module with enhanced strength and stability.

Once the low stress bilayer TiW/Ni-based UBM stack structure has been fabricated, optional layering may be provided thereover, including, and a capping layer 50 followed by a surface modification layer 60 thereover (see, FIG. 2A) or a surface modification layer 60 alone (see, FIG. 2B). The capping layer is deposited over the Ni-based barrier layer 40 to a thickness ranging from greater than 0 microns to about 1.5 microns and under operating conditions chosen for tensile stress film deposition. In particular, the capping layer is deposited at temperatures ranging from about −20° C. to about 40° C. to reduce tensile stresses, under an Ar pressure ranging from about 1.80 mTorr to about 6.0 mTorr (preferably 5.0 mTorr), and at a DC power ranging from about 6 kWatts to about 16 kWatts (preferably 12 kWatts).

Figure 6:
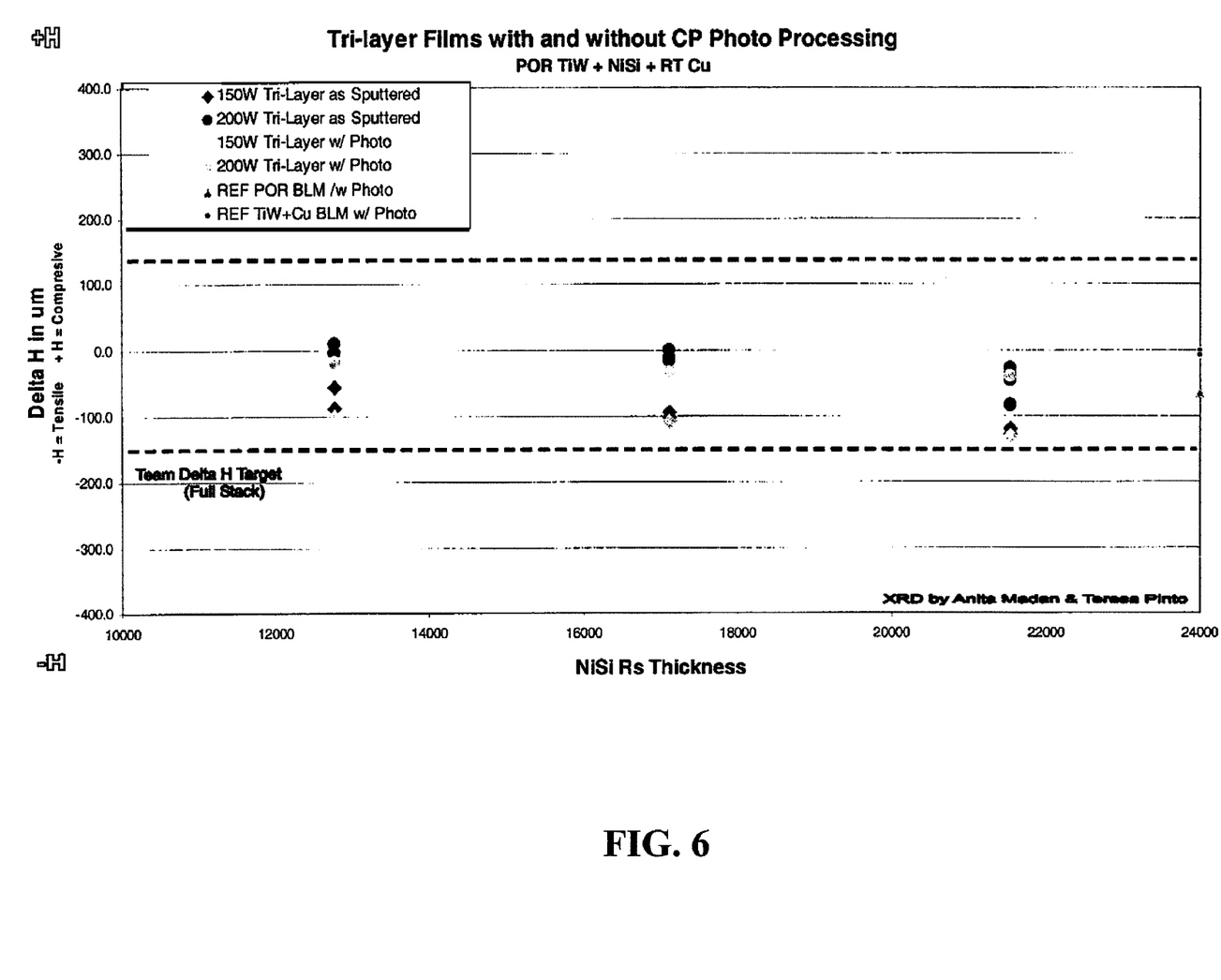
FIG. 6 is a graph depicting the low stress and minimum bowing of the present trilayer TiW/NiX/Cu UBM structures of the invention.

In accordance with one or more embodiments of the invention, the capping layer includes a Cu-based film (100% Cu or Cu—X alloy (e.g., CuNi, 10-90 wt % Cu)) deposited under the above operating conditions and under 0 Watts RF bias. Alternatively, the capping layer is a Ni-based film (100% Ni or Ni—X alloy (e.g., NiSn, 5-30 wt % Sn)) for providing additional Ni and lowering solder reactions, which is deposited under the above operating conditions and under an RF bias of about 300 Watts. Preferably, the capping layer is a 100% Cu layer deposited to a thickness of about 1 micron. Referring to FIG. 6, by depositing the capping layer under the above tensile stress operating conditions, the resultant trilayer (TiW/NiX/Cu) UBM structure maintains lower stress and minimum bowing, which is depicted as Delta H in the graph of FIG. 6.

In addition to the capping layer 50, or as an alternative thereto, a thin surface modification layer 60 is provided over the capping layer 50 (see, FIG. 2A), or the thin film 60 is provided directly over the barrier layer 40 (see, FIG. 2B showing no capping layer). The material of the thin film 60 is chosen to improve manufacturability of the electronic component by protecting the underlying Ni barrier and/or capping layers during downstream manufacturing operations. It also increases the wettability of the UBM/solder structure by acting as a controlled additive to the solder material. That is, the material of the surface modification layer 60 acts as a dopant to the solder to improve wettability of the solder for joining the solder to the UBM structure and improve the overall properties of the lead-free solder, such as, by providing the solder joints with improved electromigration behavior.

The surface modification layer 60 includes a material of immersion or electro-less gold (Au), silver (Ag), tin (Sn), cobalt (Co), zinc (Zn), or a Zn conversion coating deposited to a thickness ranging from about 100 A to about 5000 A. Alternatively, sputtering the materials of the surface modification layer 60 into the capping layer provides an alloy layer of Cu—X or Ni—X, where X is Sn, Co or Zn, whereby the top of this combined capping-modification layer is concentrated with the solder dopants of the surface modification material. In so doing, the doping of the solder that is to be deposited over the surface modification layer (or the combined layer) is controlled by the dopants residing in the surface modification layer, such that, additional insoluble metals (e.g., Ir, W, etc.) may also be added to this surface modification layer 60 for doping to add such metals to the solder.

Figure 7A:
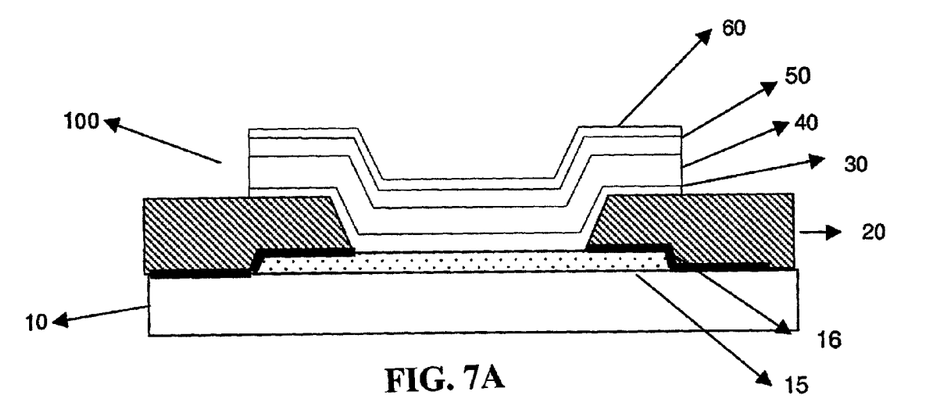
FIGS. 7A and 7B illustrate cross sectional views of bilayer and trilayer UBM capture pads fabricated from the UBM structures of FIGS. 2A and 2B.
Figure 7B:
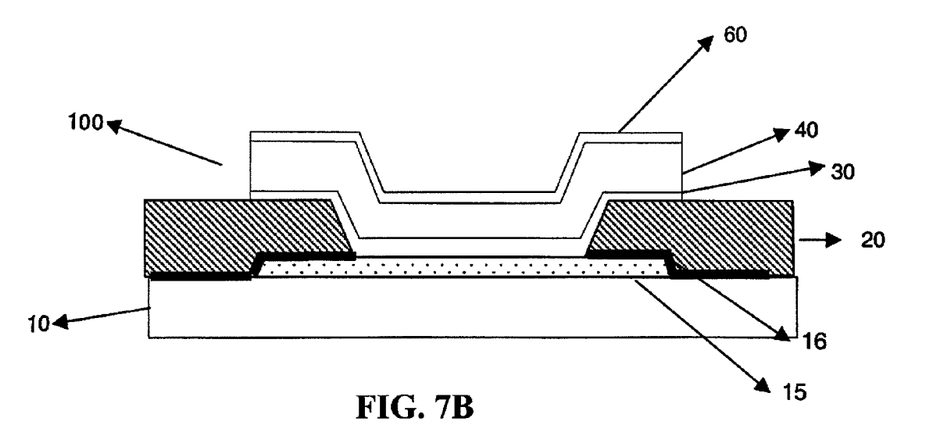

Referring to FIGS. 7A and 7B, once the UBM layers are deposited over the substrate, such layers are patterned to form a UBM capture pad 100. This UBM capture pad 100 may be a trilayer (TiW/NiX/Cu) UBM capture pad on a wafer (as is shown in FIG. 7A) or a bilayer (TiW/NiX) UBM capture pad on a wafer (as is shown in FIG. 7B.). In FIGS. 7A and 7B, the upper most layer is a surface modification layer 60.

In so doing, a photo resist material (not shown) with the designed patterns is provided on the substrate surface over the UBM layers. The resist may comprise a liquid or dry resist film that is exposed and, using known chemistry, images are developed for the desired solder interconnection pattern. This pattern forms openings in the resist layer to leave remaining resist material over the regions of the metal pads. After the images have been developed in the resist material, the substrate is cleaned, such as, using a known $O_2$ plasma cleaning step. The exposed UBM metal layers are then sequentially etched using wet chemical etchants to selectively remove the optional surface modification 60 and capping 50 layers and the barrier layer 40. The resist is then stripped using a suitable alkaline solution, such as, an aqueous KOH solution or a suitable resist stripper containing alkali and/or organic solvents to expose the TiW adhesion layer 30.

The TiW adhesion layer 30 is then etched to expose the passivation layer 20 (e.g., polyimide passivation layer). This adhesion layer 30 may be etched using wet or dry etch processes, such as, for example, using a wet peroxide-based etchant to provide the present UBM layers over metallic pads for joining to solder joints. Prior to depositing the solder interconnections on these capture pads, the substrate surface is preferably cleaned, such as, using an oxygen plasma etch, to remove any conductive haze on the exposed passivation layer surfaces resulting from carbonization of such surface (e.g., removing the conductive haze from a carbonized polyimide surface).

Figure 8A:
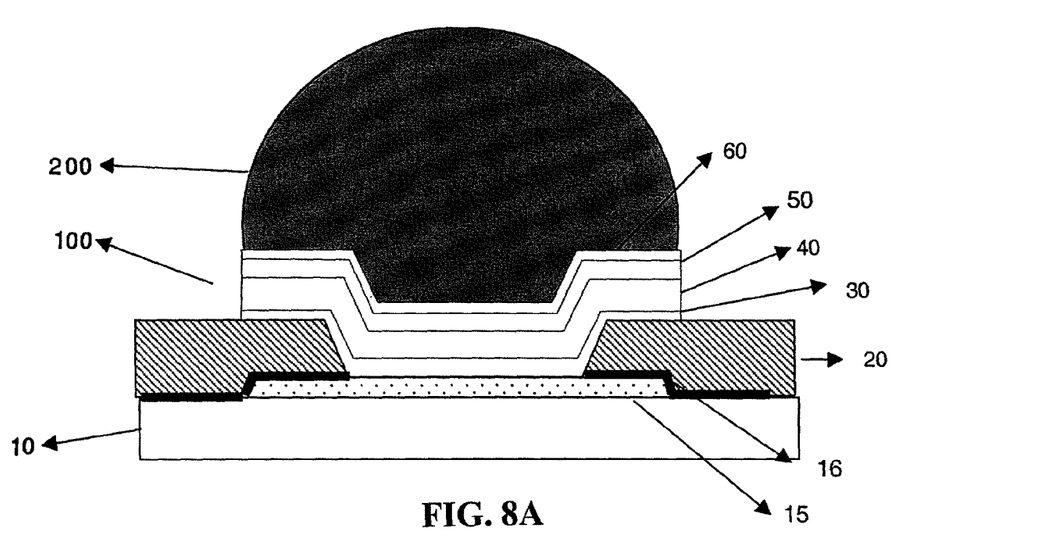
FIGS. 8A and 8B are cross sectional views showing a solder bump joined to the bilayer and trilayer UBM capture pads of FIGS. 7A and 7B.
Figure 8B:
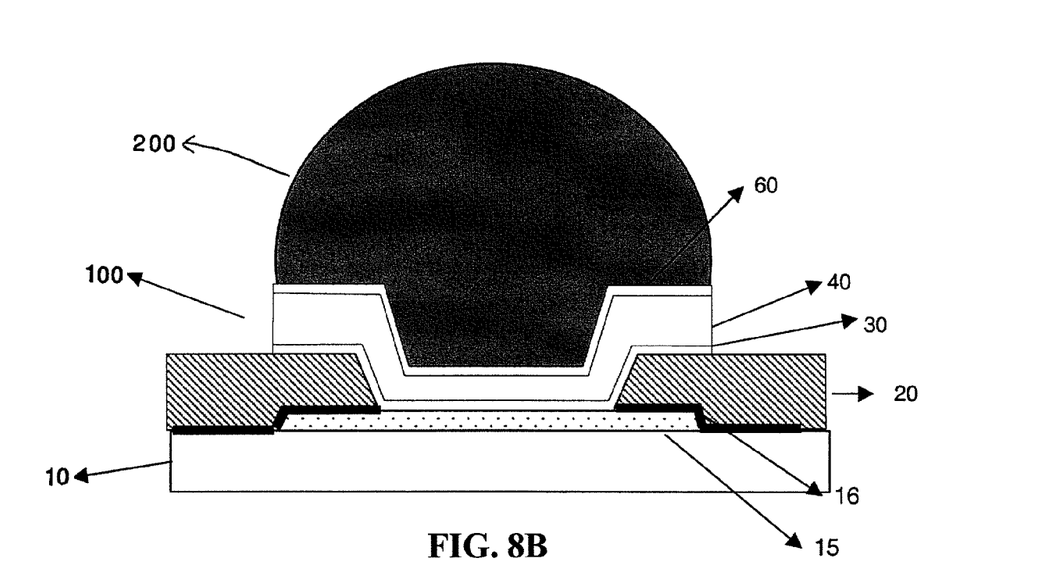
Figure 9A:
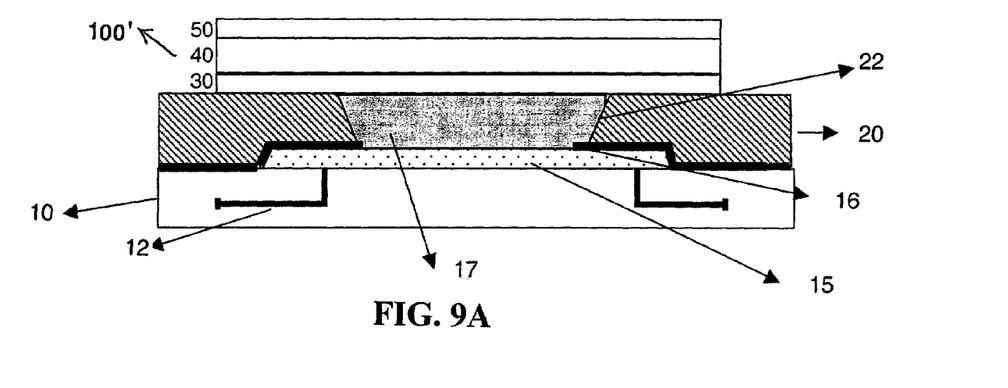
FIGS. 9A and 9B illustrate cross sectional views of alternate UBM capture pads made in accordance with the invention.
Figure 9B:
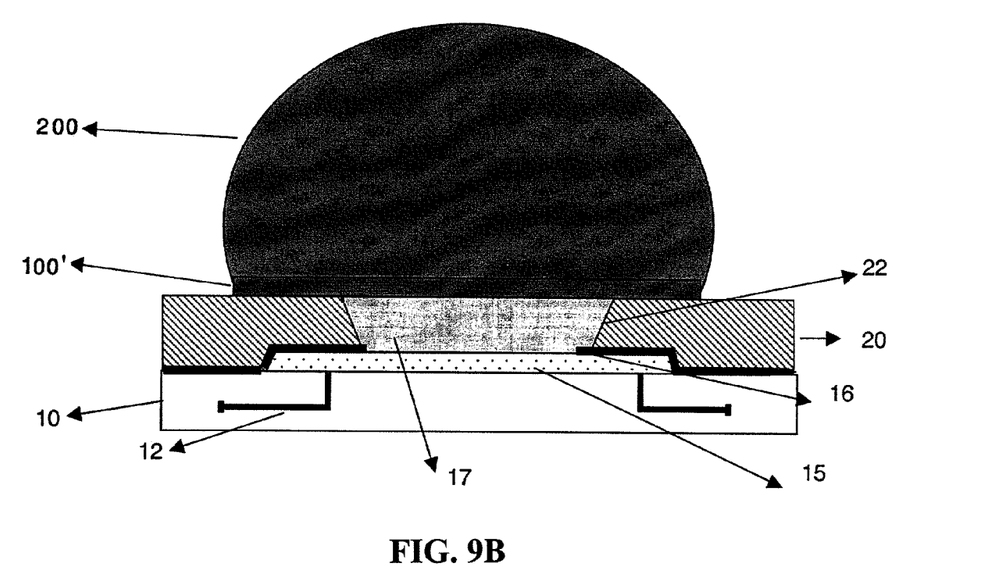

Referring to FIGS. 8A and 8B, the solder connections 200 can then be joined to the trilayer or bilayer UBM capture pads 100 using a variety of known solder deposition methods including, but not limited to, ball drop, paste screening, solder bumps (C4), as well as future generations of C4 solder processes, such as C4-NP Process. By using each solder deposition method, a variety of solders may be used for improved performance. Lead-free solder materials are preferred and are chosen based upon improving mechanical and thermal cycling performances, as well as to improve electromigration behavior. The one or more embodiments of the invention are particularly useful for any type of current and/or future generation of lead-free solder or lead-free solder alloys including, but not limited to, Sn, Sn/Ag, Sn/Ag/Cu, Sn/Cu, and the like. For example, solders such as SnCu (0.7%) or SnAg (1-3%), SnAgCu (305 or 309) can be used which are difficult to plate. The one or more embodiments of the invention are also useful for solders with ternary and quaternary additives, such as, Ni, Fe, Co, Zn, Bi, Sb, and the like.

In one or more embodiments of the invention, the UBM capture pads may be provided over any of the starting structures shown in FIGS. 1B-1E. For instance, using the starting structures of FIGS. 1B and 1D, the UBM capture pads may be provided as planar UBM capture pads 100' on a wafer having a polyimide layer 20 with Cu filled vias 17 (see, FIG. 9A). The solder connection 200 is then provided over this planar UBM capture pads 100' see, FIG. 9B). That is, the present bilayer and trilayer UBM structures may be formed over wafers with a polyimide passivation layer and over wafers without polyimide passivation layers (e.g., SiO2/Si3N4 surfaces with embedded Cu via/plugs).

Experimental Results 1

Figure 10A:
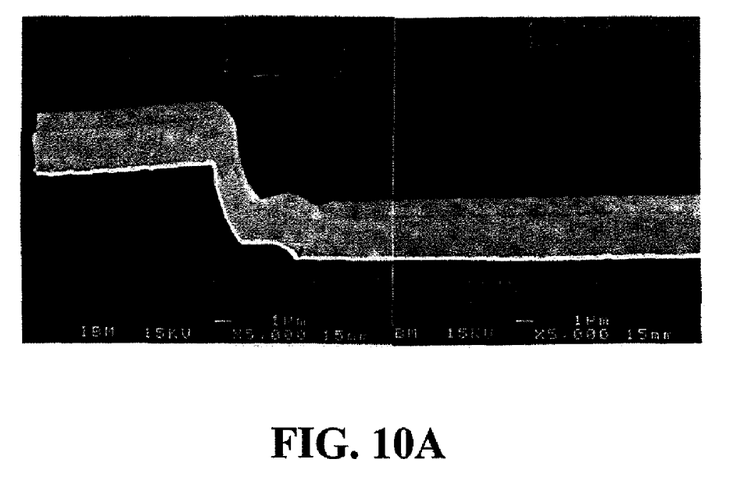
FIGS. 10A-10C illustrate SEM cross sectional views of UBM capture pads of the present invention before and after multiple reflows.
Figure 10B:
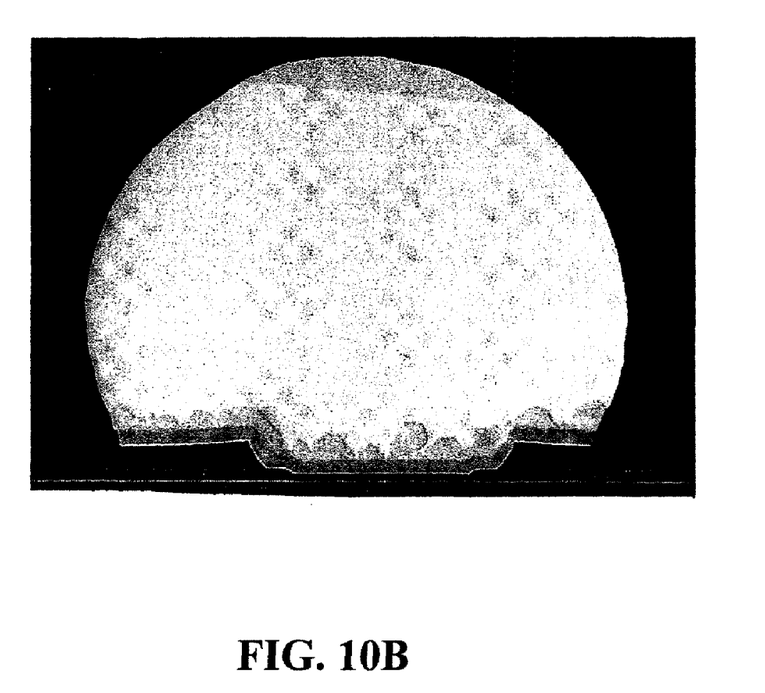
Figure 10C:
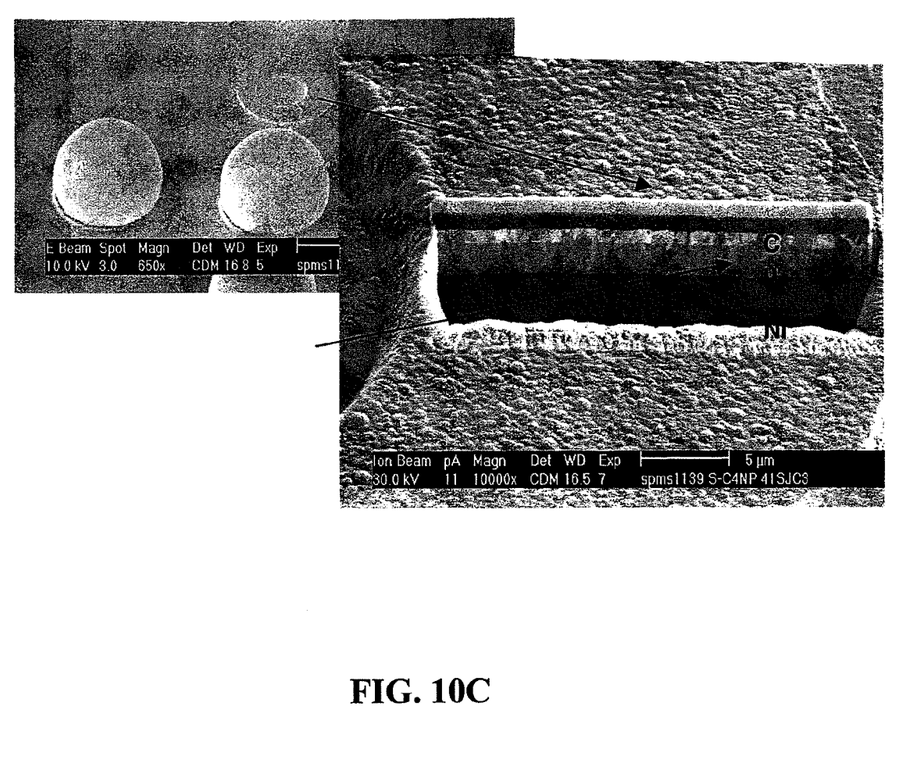

A first set of test wafers with Aluminum pads were coated with photosensitive polyimide (PSPI) 20 and vias 22 etched to 55 microns in diameter and 200 microns in pitch, which were then filled. The wafers were processed in accordance with the optimal processing parameters of an embodiment of the invention to provide trilayer UBM layers of TiW/Ni/Cu, TiW/NiSi/Cu and TiW/NiW/Cu. These trilayer UBM layers were etched to form trilayer UBM capture pads of an embodiment of the invention. The C4-NP process was employed to form solder bumps using two different solders, in particular, SnCu (0.7%) and SnAg (1.8%). After wafer dicing, chips were joined to organic packages and the post chip joined modules were processed thru multiple (2-10 times) reflows. In each reflow, the modules went through an inert gas atmosphere furnace having peak temperatures set to 245° C. for about 1 minute. The modules were subjected to quick turnaround (QTAT) reliability testing that included DTC (−40/125° C.), HTS (170° C.), LTS (−65° C.), THB (85° C./85%/3.6V), ATC 100 cycles. After the QTAT reliability stress, the modules were examined for structural integrity and mechanical testing. The solder bump shear/chip pull data measurements showed enhanced shear values and pull strengths greater than about 25 gms/C4 indicating reliable joint strengths after multiple reflows. FIG. 10A shows a SEM cross sections of the post capture pad build. FIG. 10B shows the post solder transfer after multiple reflows having sufficient structural integrity of the solder bump while FIG. 10C shows sufficient thickness of un-reacted UBM layer.

Experimental Results 2

A second set of electrically good (EG) test wafers were processed in accordance with the optimal processing parameters of an embodiment of the invention to provide trilayer UBM layers of TiW/Ni/Cu and TiW/NiSi/Cu. These trilayer UBM layers were etched to form trilayer UBM capture pads of the invention having bump pitch of 150 microns and pad diameters of 80-58 microns (i.e., using 3 on 6 mil ground rules). The C4-NP process was employed to form solder bumps using two different solders, in particular, SnCu (0.7%) and SnAg (1.8%). After wafer dicing, chips were joined to organic packages and the post chip joined modules were processed thru multiple (7 times) reflows each at 245° C. for about 1 minute. Later these modules were subjected to reliability stressing for longer times and cycles. The modules were examined for electrical, mechanical and structural integrity. The solder bump shear/chip pull data measurements showed enhanced shear values and pull strengths greater than about 25 gms/C4 indicating reliable joint strengths after multiple reflows. After reliability stressing for DTC 1500 Cycles, HTS 1500 Hrs, LTS 1000 hrs, THB 1000 hrs, ATC 2000 Cycles, no module fails were detected. Chip pull/bump shear data were similar to the data for the above first set of test wafers.

Thus, the present UBM layer deposition conditions of one or more embodiments of the invention provide resultant UBM structures having Ni-based barrier layer thicknesses greater than 0.5 microns with low composite stresses, which in turn, results in reduced bowing of the substrate during downstream fabrication processes. The lower composite stresses of the present UBM structures help improve the structural integrity of the lead-free solder joints through thermal cycling and other reliability testing and usage conditions. The UBM layers of the one or more embodiments of the invention are approximately 5 to 6 times thicker than conventional UBM layers, particularly those for use with lead-free solders, while maintaining the stress close to zero.

The one or more embodiments of the invention provide improved, cost effective UBM layers for use with lead-free solders to provide an UBM/lead-free solder joint structure having high reliability, longer power on hours, and able to withstand higher currents and high stresses during downstream processing and package module build and reliability tests. These robust UBM structures also provide low resistance contact between the metal pads and solder joint, an effective barrier to solder diffusion into the metal pad, an effective wetting layer for solder wettability, and the like. Accordingly, as the electronics industry migrates towards RoHS compliance the one or more embodiments of the invention are cost effective solutions suitable for use with these future generations of semiconductors.

Thus, having described the invention, what is claimed is:

1. A method of fabricating an under bump metallization (UBM) structure comprising:
   providing a substrate having electrically conductive connections;
   providing said substrate in a sputtering tool;
   cleaning a surface of said substrate;
   sputter depositing at least a bilayer UBM structure of a TiW adhesion layer deposited to a thickness ranging from about 0.05 microns to about 0.3 microns followed by a Ni-based barrier layer deposited to a thickness ranging from about 0.6 microns to about 3.0 microns over said cleaned substrate surface under operating conditions that provide the resultant bilayer UBM structure with composite stress ranging from about 50 MPa to about −275 MPa;
   patterning said bilayer UBM structure to form bilayer UBM capture pads on said substrate surface; and
   joining lead-free solder connections to said bilayer UBM capture pads to provide solder joints that have reliable joint strengths after multiple reflows.

2. The method of claim 1 wherein said substrate comprises an inorganic substrate or an organic substrate.

3. The method of claim 1 wherein said bilayer UBM structure comprises a TiW/NiX bilayer having said composite stress ranging from about 50 MPa to about −275 MPa.

4. The method of claim 1 wherein said Ni-based barrier layer comprises pure Ni.

5. The method of claim 1 wherein said Ni-based barrier layer comprises a Ni alloy selected from the group consisting of NiSi, NiW, NiTi, NiCu and NiSn.

6. The method of claim 1 wherein said sputtering chamber comprises a PVD tool for depositing said TiW adhesion layer and said Ni-based barrier layer in different chambers.

7. The method of claim 1 wherein said sputtering chamber comprises a linear magnetron sputtering tool for depositing said TiW adhesion layer and said Ni-based barrier layer in a single chamber.

8. The method of claim 1 wherein said lead-free solder connections are selected from the group consisting of solder balls, solder columns, solder bumps, micro bumps and micro balls.

9. The method of claim 1 wherein said lead-free solder connections comprise a material selected from the group consisting of Sn, Sn/Ag, Sn/Ag/Cu, Sn/Cu, lead-free solders with ternary additives and lead-free solders with quaternary additives.

10. The method of claim 1 further comprising:
depositing a passivation layer over said surface of said substrate;
patterning said passivation layer to form openings therein that expose said electrically conductive connections of said substrate;
depositing said bilayer UBM structure over said passivation layer and within said openings to directly contact electrically conductive connections of said substrate.

11. The method of claim 10 wherein the passivation layer is deposited to a thickness ranging from about 1 micron to about 10 microns.

12. The method of claim 1 further comprising:
depositing a passivation layer over said surface of said substrate;
patterning said passivation layer to form openings therein that expose said electrically conductive connections of said substrate;
filling said openings in said passivation layer with metallization;
planarizing said surface of said substrate; and
depositing said bilayer UBM structure directly over said planarized surface.

13. The method of claim 1 wherein bump pitch of said lead-free solder connections are selected from 20 microns, 50 microns, 100 microns, 150 microns, 200 microns, and up to 500 microns, depending on the end use of said structure.

14. A method of fabricating an under bump metallization (UBM) structure comprising:
providing a substrate having electrically conductive connections;
providing said substrate in a sputtering tool;
cleaning a surface of said substrate;
sputter depositing at least a bilayer UBM structure of a TiW adhesion layer deposited to a thickness ranging from about 0.05 microns to about 0.3 microns followed by a Ni-based barrier layer deposited to a thickness ranging from about 0.6 microns to about 3.0 microns over said cleaned substrate surface under operating conditions that provide the resultant bilayer UBM structure with composite stress ranging from about 50 MPa to about −275 MPa, wherein said TiW adhesion layer is deposited onto said substrate under operating conditions that provide said TiW adhesion layer with compressive stress, said operating conditions comprising:
a sputtering temperature ranging from about 25° C. to about 270° C.;
an inert gas at a pressure ranging from about 1.8 mTorr to about 7.5 mTorr; and
an operating power ranging from about 4 kW to about 12 kW;
patterning said bilayer UBM structure to form bilayer UBM capture pads on said substrate surface; and
joining lead-free solder connections to said bilayer UBM capture pads to provide solder joints that have reliable joint strengths after multiple reflows.

15. The method of claim 14 wherein said Ni-based barrier layer is deposited directly over said TiW adhesion layer under compressive stress operating conditions comprising:
providing said substrate on a water cooled electrode maintained at a temperature ranging from about −20° C. to about 40° C.;
a sputtering temperature ranging from about 25° C. to about 270° C.;
an inert gas at a pressure ranging from about 1.8 mTorr to about 6.0 mTorr;
an operating power ranging from about 6 kW to about 14 kW; and
applying an RF bias power ranging from 0 Watts to about 300 Watts to said substrate to modulate stresses in said Ni-based barrier layer so that the resultant bilayer UBM structure is provided with said composite stress.

16. A method of fabricating an under bump metallization (UBM) structure comprising:
providing a substrate having electrically conductive connections;
providing said substrate in a sputtering tool;
cleaning a surface of said substrate;
cooling said substrate prior to depositing a bilayer UBM structure to generate reproducible composite stresses in subsequently formed UBM structures;
sputter depositing at least said bilayer UBM structure of a TiW adhesion layer deposited to a thickness ranging from about 0.05 microns to about 0.3 microns followed by a Ni-based barrier layer deposited to a thickness ranging from about 0.6 microns to about 3.0 microns over said cleaned substrate surface under operating conditions that provide the resultant bilayer UBM structure with composite stress ranging from about 50 MPa to about −275 MPa;
patterning said bilayer UBM structure to form bilayer UBM capture pads on said substrate surface; and
joining lead-free solder connections to said bilayer UBM capture pads to provide solder joints that have reliable joint strengths after multiple reflows.

17. A method of fabricating an under bump metallization (UBM) structure comprising:
providing a substrate having electrically conductive connections;
providing said substrate in a sputtering tool;
cleaning a surface of said substrate;
sputter depositing at least a bilayer UBM structure of a TiW adhesion layer deposited to a thickness ranging from about 0.05 microns to about 0.3 microns followed by a Ni-based barrier layer deposited to a thickness ranging from about 0.6 microns to about 3.0 microns over said cleaned substrate surface under operating conditions that provide the resultant bilayer UBM structure with composite stress ranging from about 50 MPa to about −275 MPa;
depositing a third layer over the bilayer TiW/Ni-based UBM stack to fabricate a trilayer UBM stack;
patterning said trilayer UBM structure to form trilayer UBM capture pads on said substrate surface; and
joining lead-free solder connections to said trilayer UBM capture pads to provide solder joints that have reliable joint strengths after multiple reflows.

18. The method of claim 17 wherein said third layer comprises a surface modification layer deposited over said Ni-based barrier layer to a thickness ranging from about 100 Å to about 500 microns, said surface modification layer comprising a solder doping material selected from the group consisting of immersion or electro-less Au, Ag, Sn, Co, Zn, a Zn conversion coating, Ir, and W.

19. The method of claim 18 wherein said third layer comprises a bilayer of a capping layer deposited under tensile stress conditions followed by deposition of said surface modification layer, said capping layer comprising a Cu-based layer or a Ni-based layer.

* * * * *